United States Patent [19]

Nishihara et al.

[11] Patent Number: 4,837,515
[45] Date of Patent: * Jun. 6, 1989

[54] RADIO FREQUENCY COIL FOR NUCLEAR MAGNETIC RESONANCE IMAGING

[75] Inventors: Susumu Nishihara; Kiyoshi Yoda, both of Amagasaki, Japan

[73] Assignee: Mitsubishi Denki Kabushiki Kaisha, Tokyo, Japan

[*] Notice: The portion of the term of this patent subsequent to Jan. 19, 2005 has been disclaimed.

[21] Appl. No.: 26,891

[22] Filed: Mar. 17, 1987

[30] Foreign Application Priority Data

Sep. 26, 1986 [JP] Japan .................. 61-228915

[51] Int. Cl.$^4$ .................................... G01R 33/20
[52] U.S. Cl. ................... 324/318; 324/322; 333/219
[58] Field of Search ............. 324/307, 309, 318, 319, 324/320, 322; 333/219, 235; 128/653

[56] References Cited

U.S. PATENT DOCUMENTS

| 4,506,224 | 3/1985 | Krause | 324/319 |
| 4,602,234 | 7/1986 | Butson | 324/320 |
| 4,634,980 | 1/1987 | Misic et al. | 324/322 |
| 4,680,548 | 7/1987 | Edelstein et al. | 324/318 |
| 4,682,125 | 7/1987 | Harrison et al. | 324/318 |
| 4,686,473 | 8/1987 | Chesneau et al. | 324/319 |
| 4,694,255 | 9/1987 | Hayes | 324/318 |
| 4,720,680 | 1/1988 | Nishihara et al. | 324/322 |

FOREIGN PATENT DOCUMENTS 0160942 11/1985 European Pat. Off. .
61-95234 5/1986 Japan .

OTHER PUBLICATIONS

"An Efficient Decoupler Coil Design Which Reduces Heating in Conductive Samples in Superconducting Spectrometers". *Journal of Magnetic Resonance*, vol. 36, pp. 447–451, 1979.

Primary Examiner—Stewart J. Levy
Assistant Examiner—Kevin D. O'Shea
Attorney, Agent, or Firm—Oblon, Fisher, Spivak, McClelland & Maier

[57] ABSTRACT

A radio frequency coil for nuclear magnetic resonance imaging comprises two annular conductors which are coaxially disposed at opposite ends of a prescribed axis and at least one pair of longitudinal conductor groups which are symmetrically disposed in parallel to the prescribed axis and extend longitudinally from one annular conductor to the other. Each longitudinal conductor group comprises a plurality of longitudinally-extending electrical conductors whose ends are secured and electrically connected to the annular conductors. The longitudinal conductors are preferably in the form of electrically conducting wires, tubes, or plates. The annular conductors can be in the form of one-piece rings or in the form of one or more pairs of arcuate plates which are electrically connected with one another and disposed about the prescribed axis in the form of a ring. Electrically conducting guard rings which are electrically insulated form the inner surface of the coil may be coaxially disposed inside the annular conductors.

23 Claims, 4 Drawing Sheets

RADIO FREQUENCY COIL FOR NUCLEAR MAGNETIC RESONANCE IMAGING

BACKGROUND OF THE INVENTION

1. Field of the Invention

This invention relates to a radio frequency coil, and more particularly to a radio frequency coil for use in a nuclear magnetic resonance imaging apparatus for medical diagnosis.

2. Discussion of Background

A radio frequency coil for nuclear magnetic resonance imaging is in effect a radio frequency antenna which is used to generate a radio frequency magnetic field for exciting the nuclei in a sample, as well as to receive the radio frequency signals which are emitted by the excited nuclei. FIG. 1 illustrates a conventional radio frequency coil of the type described in the Journal of Magnetic Resonance, Volume 36, pages 447–451 (1979). The illustrated coil comprises a pair of H-shaped members 1 which are made of plates of an electrically conducting material such as copper. The H-shaped members 1 are symmetrically disposed about a longitudinal axis so as to form a hollow, cylindrical tube. Each H-shaped member 1 has a longitudinally-extending web 1a, which is referred to as a vertical band, and two laterally-extending flanges 1b at opposite end of the web 1a, the flanges 1b being referred to as wings. Adjacent flanges 1b are electrically connected with one another by means of chip capacitors 2. Two electrically conducting rings 3a and 3b, at least one of which is grounded, are coaxially disposed within the tube at its opposite ends. The guard rings are separated from the inner surface of the H-shaped members 1 by an unillustrated layer of an electrically insulating material such as Teflon. The guard rings shield a sample from the electric fields which are generated by the radio frequency voltage present between the wings and decrease dielectric losses within a sample. Two electrodes 4a and 4b are integrally formed on one of the H-shaped members 1 and on the bottom guard ring 3b, respectively. The two electrodes 4a and 4b serve as feeding points for the coil and are connected to an unillustrated radio frequency transceiver through an unillustrated impedance matching circuit. The transceiver is used to excite the radio frequency coil and to receive the signals which the coil picks up from a sample.

The H-shaped members 1, the chip capacitors 2, and the guard rings 3a and 3b together form a three-dimensional circuit which is equivalent to a series resonant circuit, the resonant frequency of which can be adjusted by variable capacitors in the unillustrated impedance matching circuit.

Because each of the webs 1a of this conventional radio frequency coil is a single conducting plate, the stray capacitances between the coil and its surroundings are large, making it difficult for the coil to cope with magnetic fields of higher frequencies. Furthermore, when a plurality of such coils are used in combination, the efficiency of magnetic field generation decreases due to eddy current.

SUMMARY OF THE INVENTION

It is an object of the present invention to provide a radio frequency coil for nuclear magnetic resonance imaging in which stray capacitances between the coil and its surroundings are reduced.

This object is achieved by dividing the longitudinal conductors of a radio frequency coil (corresponding to the vertical bands of a conventional radio frequency coil) into a plurality of separate, parallel conductors, as a result of which stray capacitances are decreased.

A radio frequency coil in accordance with the present invention comprises a pair of annular conductors (corresponding to the wings of a conventional radio frequency coil) coaxially disposed at opposite ends of a prescribed axis, and at least one pair of longitudinal conductor groups which are symmetrically disposed about the prescribed axis, each group comprising a plurality of electrical conductors which extend longitudinally in parallel to the prescribed axis and whose ends are electrically connected to the annular conductors. Preferred forms of the longitudinal conductors are electrically conducting wires, plates, or tubes.

The annular conductors at opposite ends of the axis can each be a one-piece ring, or they can be formed from one or more pairs of arcuate plates which are electrically connected with one another and which are disposed about the prescribed axis in the shape of an annulus, the number of pairs of arcuate plates being equal to the number of pairs of longitudinal conductor groups. The arcuate plates can be connected with one another by capacitive or conductive coupling.

The coil may further comprise two electrically conducting guard rings which are coaxially disposed with respect to the prescribed axis within the coil. Each electrically conducting guard ring is surrounded by one of the annular conductors and is electrically insulated therefrom. The guard rings may be stationary with respect to the annular conductors, or they may be supported so as to be capable of moving in the longitudinal direction of the coil with respect to the annular conductors. By moving the guard rings in the longitudinal direction, the amount of overlap between the guard rings and the annular conductors can be varied, thus varying the capacitance and the resonant frequency of the coil.

The longitudinal conductor groups can extend continuously from one annular conductor to the other. Alternately, one or both of the longitudinal conductor groups of each pair can be transversely divided in two at its midportion with the two halves connected with one another by capacitive coupling. If the capacitive coupling is performed with a variable capacitor element, the resonant frequency of the coil can be adjusted by means of the variable capacitor element.

The present invention may also include a balanced feed circuit for feeding balanced currents.

BRIEF DESCRIPTION OF THE DRAWINGS

In the drawings, the same reference numerals indicate the same or corresponding parts.

DESCRIPTION OF THE PREFERRED EMBODIMENTS

Figure 1:
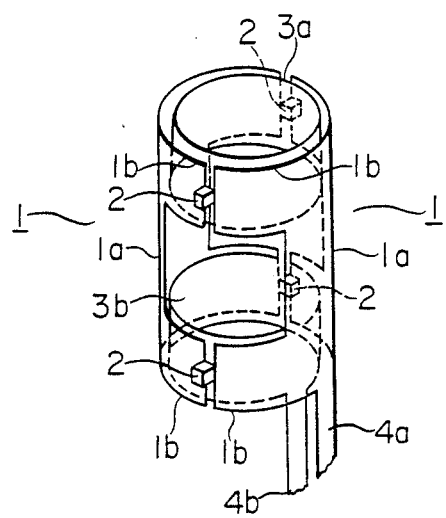
FIG. 1 is a schematic perspective view of a conventional radio frequency coil.

Hereinbelow, a number of preferred embodiments of a radio frequency coil according to the present invention will be described while referring to the accompanying drawings, FIG. 2 of which shows a first embodiment. The overall structure of this first embodiment is similar to that of the conventional coil of FIG. 1. A pair of annular conductors 5 are coaxially disposed at opposite ends of the longitudinal axis of the coil. Each of the annular conductors 5 comprises a pair of electrically conducting plates 5a which are bent into arcs and are symmetrically disposed about the longitudinal axis of the coil so as to form a circular ring and give the coil a circular transverse cross-sectional shape. The ends of adjacent plates 5a are electrically connected with one another by chip capacitors 2. These plates 5a correspond to the flanges 1b of the conventional coil. A top guard ring 3a and a bottom guard ring 3b, a least one of which is grounded, are coaxially disposed inside the annular conductors 5 and are electrically insulated from the inner surfaces of the annular conductors 5 by unillustrated layers of electrical insulation. Each plate 5a of the upper annular conductor 5 is connected with the corresponding plate 5a of the lower annular conductor 5 by a longitudinal conductor group 6. Each longitudinal conductor group 6 comprises a plurality of longitudinal electrical conductors 6a which are disposed in parallel with the longitudinal axis of the coil and are separated from one another in the circumferential direction. The ends of the longitudinal conductors 6a are secured to the conducting plates 5a by suitable means so as to form a good electrical connection therebetween. In FIG. 2, the longitudinal conductors 6a are in the form of wires, but they can also be in the form of tubes or plates. The width of each longitudinal conductor group 6 measured circumferentially spans a central angle A. There is no restriction on the magnitude of this angle A, but preferably it is from about 70 to 100 degrees, and more preferably is from about 80 to 90 degrees. The longitudinal conductor groups 6 correspond to the webs 1a, i.e., the vertical bands of the coil of FIG. 1.

Figure 2:
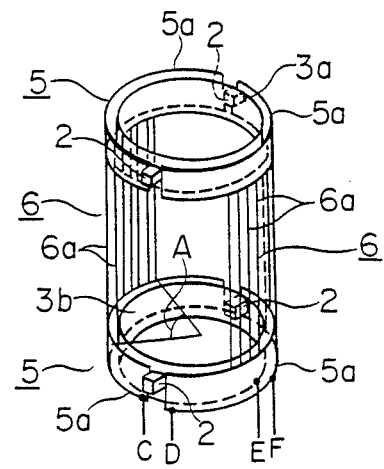
FIG. 2 is a schematic perspective view of a first embodiment of a radio frequency coil according to the present invention.

A radio frequency coil according to the present invention functions in exactly the same manner as the conventional radio frequency coil of FIG. 1. Namely, the annular conductors 5, the longitudinal conductor groups 6, the chip capacitors 2, and the guard rings 3a and 3b form a resonant circuit which is excited by an unillustrated transceiver through an unillustrated feed circuit. However, because the longitudinal conductor groups 6 each comprise a plurality of separate longitudinal conductors 6a, the surface area of the longitudinal conductor groups 6 is smaller than that of the vertical bands of a conventional coil of the same size, with the result that stray capacitances between the coil and its surroundings are decreased and high frequencies can be more easily dealt with.

When a whole body coil (a coil which surrounds the human torso) is used together with a head coil (a coil which surrounds the head), the longitudinal conductor groups 6 of the whole body coil must be perpendicular to the longitudinal conductor groups 6 of the head coil so that the two will not interfere with one another, as a result of which the directions of the magnetic fields produced within the two coils are perpendicular. In a conventional radio frequency coil, this can result in eddy current flowing in the vertical bands of one of the coils, but in the present invention, since the longitudinal conductor groups 6 comprise a plurality of separate conductors 6a, it is difficult for an eddy current to flow therein, and the magnetic field generating efficiency does not decrease.

Current can be fed to the coil of FIG. 2 at various locations; one example of a pair of feeding points is Point C and Point D on confronting electrically conducting plates 5a. Another example of a pair of feeding points is Point E, on the bottom guard ring 3b, and Point F, on one of the lower electrically conducting plates 5a.

Figure 3:
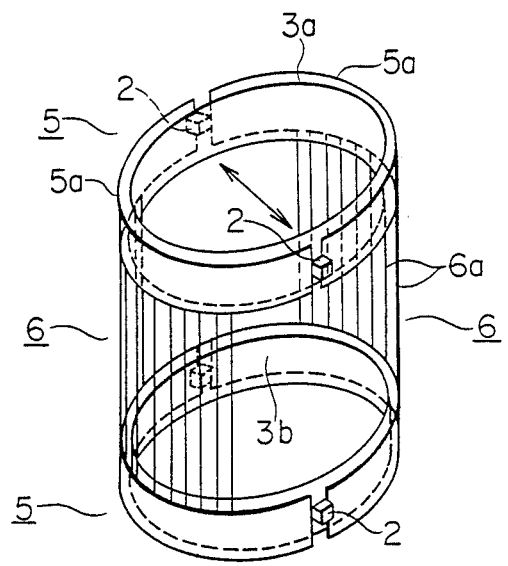
FIG. 3 is a schematic perspective view of a second embodiment of the present invention in which the coil has an elliptical transverse cross-sectional shape and the longitudinal conductors are disposed at opposite ends of the major axes of the cross sections.
Figure 4:
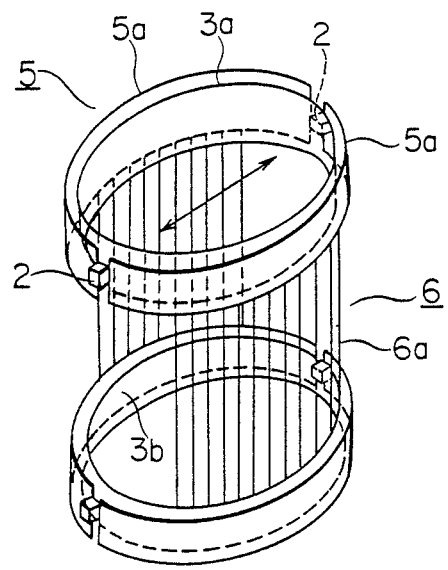
FIG. 4 is a schematic perspective view of a third embodiment of the present invention in which the coil has an elliptical transverse cross-sectional shape and the longitudinal conductors are disposed at opposite ends of the minor axes of the cross sections.

When a radio frequency coil is used in a whole body nuclear magnetic resonance imaging apparatus, due to the large dimensions of the coil (which must be large enough in diameter to surround any part of the human body), the efficiency of magnetic field generation and the signal-to-noise ratio of input signals decrease. It is possible to compensate for these decreases by designing the coil so that it has an elliptical rather than a circular transverse cross-sectional shape, which results in a higher magnetic field generating efficiency and signal-to-noise ratio. FIG. 3 and FIG. 4 illustrate a second and a third embodiment, respectively, of the present invention which are designed to surround the human body. The annular conductors 5 and the guard rings 3a and 3b are curved so that the coil has an elliptical transverse cross section. The embodiment of FIG. 3 employs two longitudinal conductor groups 6 which are disposed at opposite ends of the major axes of transverse cross sections of the coil. Aside from the elliptical shape, the structure is identical to that of the embodiment of FIG. 2. The arrow in FIG. 3 indicates the direction of the magnetic field generated within the coil. If the coil is disposed so that its longitudinal axis and the major axes of the transverse cross sections are horizontal, the direction of the magnetic field generated within the coil will be vertical.

In contrast, in the embodiment of FIG. 4, two longitudinal conductor groups 6 are disposed at opposite ends of the minor axes of the transverse cross sections of the coil, so that the direction of the magnetic field within the coil, indicated by the arrow, will be horizontal when the coil is placed so that its longitudinal axis and the major axes of the transverse cross sections are horizontal. The operation of these two embodiments is identical to that of the embodiment of FIG. 2. The efficiency of magnetic field generation and the signal-to-noise ratio of an elliptical coil are significantly higher than for a coil with a circular transverse cross section.

Figure 5:
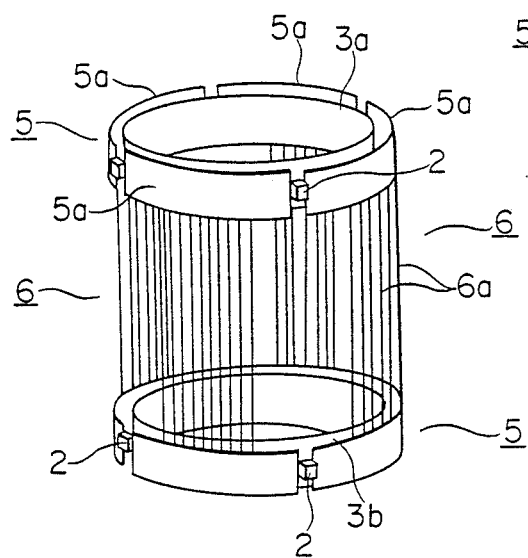
FIG. 5 is a schematic perspective view of a fourth embodiment of the present invention in which two pairs of longitudinal conductor groups are used.

The embodiment of FIG. 2 employs a single pair of longitudinal conductor groups 6 and a single pair of conducting plates 5a for each annular conductor 5, but it is possible to employ a larger number of pairs. FIG. 5 illustrates a fourth embodiment of the present invention which employs two pairs of conducting plates 5a for each annular conductor 5 and two pairs of longitudinal conductor groups 6, all of which are symmetrically disposed about the longitudinal axis of the coil. As in the previous embodiments, the ends of adjacent conducting plates 5a are connected with one another by chip capacitors 2. The operation of this embodiment is identical to that of the embodiment of FIG. 2.

Figure 6:
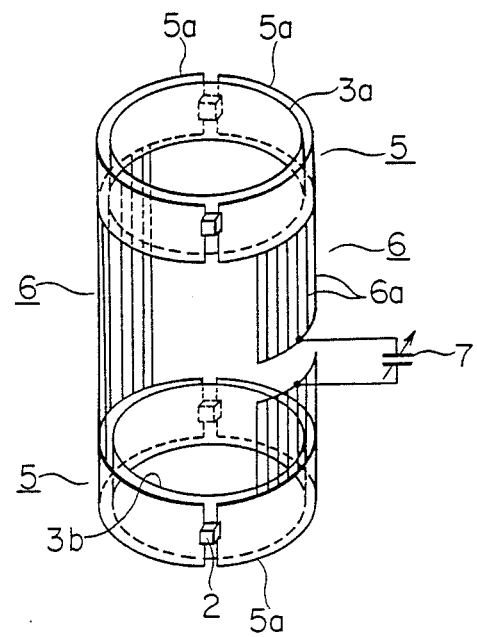
FIG. 6 is a schematic perspective view of a fifth embodiment of the present invention in which one of the longitudinal conductor groups is divided transversely in two and the upper and lower halves are connected by capacitive coupling.

FIG. 6 illustrates a fifth embodiment of the present invention. The overall structure of this embodiment is similar to that of the embodiment of FIG. 2, but whereas in FIG. 2 all of the longitudinal conductors 6a extend continuously from the upper annular conductor 5 to the lower annular conductor 5, in the embodiment of FIG. 6, one of the longitudinal conductor groups 6 is divided transversely in two at its midportion. The lower ends of the longitudinal conductors 6a in the upper half of the divided longitudinal conductor group 6 are short circuited, and similarly the upper ends of the longitudinal conductors 6a in the lower half of the divided longitudinal conductor group 6 are short circuited by suitable means. The short-circuited ends of the longitudinal conductors 6a in the upper half and the lower half are connected with one another by a variable capacitor 7. By adjusting the variable capacitor 7, the resonant frequency of the coil can be varied. The operation of this embodiment is the same as that of the previous embodiments. If more than one pair of longitudinal conductor groups 6 are employed, as in the embodiment of FIG. 5, one conductor group 6 of each pair can be divided in two and the short-circuited ends of the longitudinal conductors 6a can be connected by a variable capacitor 7 in the same manner as shown in FIG. 6. Furthermore, if the other longitudinal conductor group 6 of each pair is also divided in two, the ends of the conductors 6a in the other longitudinal conductor group 6 are short-circuited, and the short circuited ends of the other longitudinal conductor group 6 are connected by a capacitor element, the frequency range of the coil can be increased.

Figure 7:
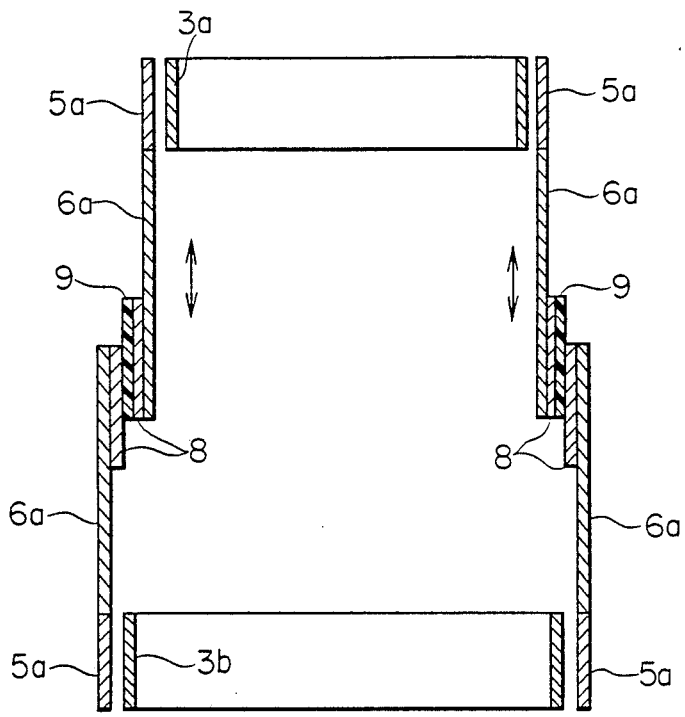
FIG. 7 is a cross-sectional view of a sixth embodiment of the present invention in which the upper and lower halves of the longitudinal conductor groups overlap one another in the longitudinal direction, a dielectric material is disposed in the overlapping portions, and the capacitance of the coil can be changed by varying the size of the overlapping portions.

FIG. 7 is a cross-sectional view of a sixth embodiment of the present invention in which a different means is employed for adjusting the resonant frequency of the coil. In this embodiment, the coil has one pair of longitudinal conductor groups 6, each of which is divided transversely in two at its midportion. The ends of the longitudinal conductors 6a in the bottom half and in the top half of each longitudinal conductor group 6 are short circuited by separate electrically conducting plates 8. Each plate 8 is secured to the longitudinal conductors 6a of one longitudinal conductor group 6 and extends circumferentially part way around the coil for the width of the group 6 on which it is mounted. The plates 8 which are secured to the upper halves of the longitudinal conductor groups 6 overlap the plates 8 for the bottom halves of the longitudinal conductor groups 6 in the longitudinal direction, and a dielectric material 9 is disposed between the upper plates 8 and the lower plates 8 in the overlapping portions. The dielectric material 9 is in the form of strips having approximately the same height and width as the plates 8. Examples of a suitable dielectric material are porcelain and a synthetic resin such as polytetrafluoroethylene. In FIG. 7, the dielectric material 9 is secured to the outer surface of the upper plates 8 and is in sliding contact with the inner surface of the lower plates 8, but alternatively it can be secured to the inner surface of the lower plates 8 and be in sliding contact with the upper plates 8. The lower halves of the longitudinal conductor groups 6 are shown as being disposed on the outside of the upper halves, but it is possible for the lower halves to be disposed on the inside. The upper and lower halves of the coil are supported so that at least one half (including the annular conductor 5, the longitudinal conductors 6a, the plates 8, and the guard ring for that half of the coil) can be moved longitudinally as a single unit with respect to the other half of the coil, thereby varying the size of the overlapping portions of the plates 8. The structure of this embodiment is otherwise the same as that of the embodiment of FIG. 2.

In this embodiment, the longitudinal conductors 6a in the upper half of the coil are electrically connected with those in the lower half of the coil by capacitive coupling through the dielectric material 9. By varying the amount of overlap of the upper and lower plates 8, the capacitance and thus the resonant frequency of the coil can be changed. Therefore, the resonant frequency of the coil can be adjusted by moving one or both halves of the coil in the longitudinal direction so that there is relative movement between the two halves. The operation of this embodiment is otherwise the same as that of the previous embodiments. A radio frequency coil having this structure can have a circular transverse cross section, like the embodiment of FIG. 2, or an elliptical one, like those of FIGS. 3 and 4. Furthermore, it may comprise more than one pair of longitudinal conductor groups 6, like the embodiment of FIG. 6. Since each of the longitudinal conductor groups 6 is divided into a plurality of longitudinal conductors 6a, stray capacitances are reduced and eddy current are prevented in the same manner as in the embodiment of FIG. 2.

Figure 8:
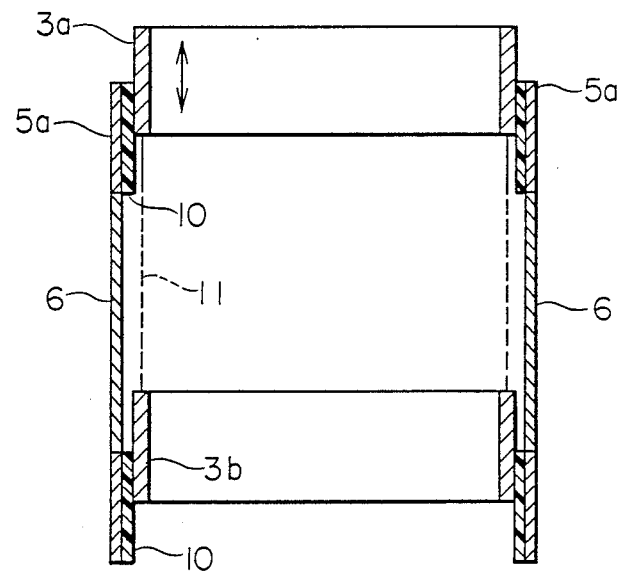
FIG. 8 is a cross-sectional view of a seventh embodiment of the present invention in which the guard rings are connected by an electrically insulating link and can be moved together in the longitudinal direction of the coil.

In the previous embodiments, the guard rings 3a and 3b remain stationary with respect to the annular conductors 5, but by moving the guard rings with respect to the annular conductors 5, it is possible to adjust the capacitance and thus the resonant frequency of the coil. FIG. 8 is a cross-sectional view of a seventh embodiment of the present invention in which a pair of guard rings 3a and 3b are supported by suitable unillustrated means so as to be movable in the longitudinal direction of the coil. The guard rings are electrically insulated from the annular conductors 5 by dielectric layers 10 which are secured to the inner surfaces of the conducting plates 5a and are in sliding contact with the outer surfaces of the guard rings, although the dielectric layers may be instead secured to the outer surfaces of the guard rings. The top guard ring 3a and the bottom guard ring 3b are rigidly connected with one another by an electrically insulating link 11 which enables the guard rings to be moved together. The structure of this embodiment is otherwise identical to that of the embodiment of FIG. 2. By moving the guard rings up and down, the amount of overlap between the guard rings and the conducting plates 5a is varied, as a result of which the capacitance and thus the resonant frequency of the equivalent resonant circuit formed by the coil can be adjusted. Movable guard rings of this type can be employed with any of the previous embodiments.

Figure 9:
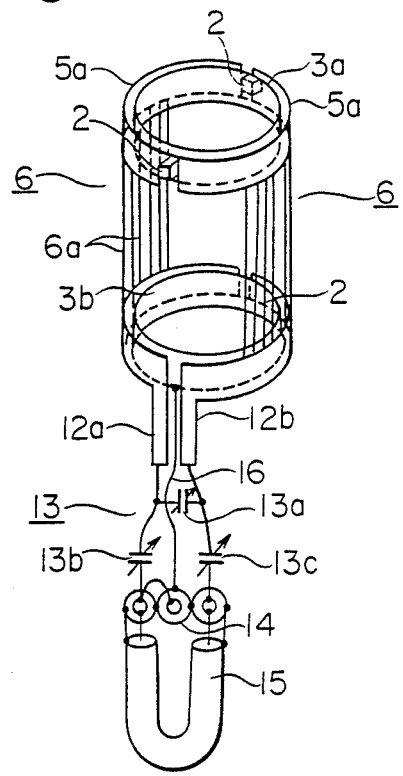
FIG. 9 is a schematic perspective view of an eighth embodiment of the present invention including a balanced feed circuit.

In order for a radio frequency coil to have good stability, a high value of Q, and good sensitivity, it is important that the feeding points of the coil be fed balanced currents, i.e., currents of equal magnitude but of opposite phase. FIG. 9 illustrates a ninth embodiment of the present invention which includes a balanced feed circuit for feeding balanced currents to the coil. The structure of the coil itself is similar to that of the embodiment of FIG. 2 with the exception that a pair of electrodes 12a and 12b are formed on the confronting ends of the two conducting plates 5a of the lower annular conductor 5 and that these two confronting ends are not connected by a chip capacitor 2 whereas the other confronting ends are. The electrodes 12a and 12b serve as feeding points corresponding to Point C and Point D of FIG. 2. The balanced feed circuit comprises a balanced impedance matching circuit 13 comprising three variable capacitors 13a–13c, and a balanced-to-unbalanced converter in the form of a half-wavelength coaxial cable 15. A first variable capacitor 13a of the impedance matching circuit 13 is connected across the electrodes 12a and 12b. A second variable capacitor 13b and a third variable capacitor 13c are connected in parallel to opposite ends of the first variable capacitor 13a. The ends of the second and third variable capacitors 13b and 13c which are not connected to the first variable capacitor 13a are connected to one another through the inner conductor of the coaxial cable 15. Both ends of the outer conductor of the coaxial cable 15 are connected to the ground electrode of a terminal 14 which is connected to an unillustrated transceiver by an unillustrated coaxial cable. The end of the second variable capacitor 13b which is connected to the coaxial cable 15 is also connected to the hot electrode of the terminal 14. The bottom guard ring 3b is connected to the ground electrode of the terminal 14 through a ground wire 16. Instead of a half-wavelength coaxial cable 15, it is possible to use other types of balanced-to-unbalanced converter, such as a Sperrtopf circuit or a transformer with a balun core.

Figure 10:
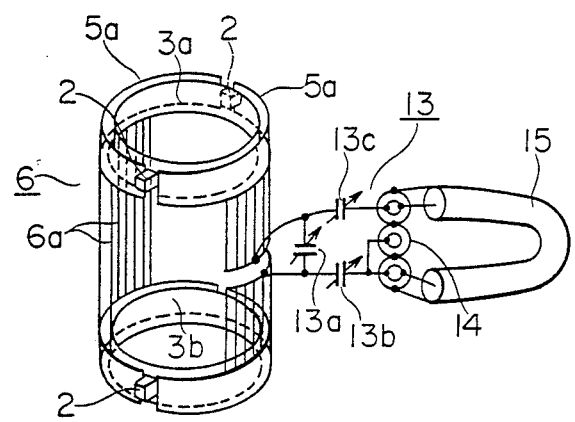
FIG. 10 is a schematic perspective view of a ninth embodiment of the present invention in which a balanced feed circuit is connected between the upper and lower halves of one of the longitudinal conductor groups.

FIG. 10 illustrates a ninth embodiment of the present invention in which the balanced feed circuit of FIG. 9 is used with a radio frequency coil having the same structure as the coil of FIG. 6. The first variable capacitor 13a of the impedance matching circuit 13 serves the same purpose as the variable capacitor 7 of FIG. 6 and can be used to adjust the resonant frequency of the coil. The operation of this embodiment is the same as that of the previous embodiments. In the event that the coil comprises more than one pair of longitudinal conductor groups 6, one balanced feed circuit can be connected to one longitudinal conductor group 6 of each pair in the manner shown in FIG. 10.

In each of the previous embodiments, the conducting plates 5a of the annular conductors 5 are electrically connected with one another by fixed capacitors, i.e., chip capacitors 2, but it is possible to employ variable capacitors instead. Furthermore, instead of connecting adjoining plates 5a by capacitive coupling, they can be connected by conductive coupling. For example, adjacent plates 5a can be electrically connected with one another by wires or other electrical conductors, or they can be directly connected with one another by pressure welding, soldering, or other method which produces a good electrical connection. Accordingly, it is also possible for each annular conductor 5 to be a one-piece ring.

In each of the illustrated embodiments, two guard rings 3a and 3b are employed, but the guard rings are not essential to the operation of the coil and are therefore optional.

What is claimed is:

1. A radio frequency coil for receiving input radio frequency magnetic signals for exciting nuclei in a sample and for delivering radio frequency signals which are emitted by said excited nuclei for nuclear magnetic resonance imaging, comprising:
   two annular conductor means including two annular conductors which are made of an electrically conducting material and which are coaxially disposed with respect to a prescribed axis;
   at least one pair of longitudinal conductor groups which are symmetrical disposed about said prescribed axis, each of said longitudinal conductor groups comprising a plurality of electrical conductors which extend longitudinally in parallel to said prescribed axis, which are separated from one another in the circumferential direction of said coil, and which have one end secured to and electrically connected to one of said annular conductors and the other end secured to and electrically connected to said other annular conductor and wherein at least one group of each of said one pair of conductor groups has said electrical conductors such that each of said conductors extend continuously from one of said annular conductors to the other of said annular conductors in order to form a direct electrical connection between said one annular conductor and said other annular conductor, input feeding means connected to at least one of said two annular conductors for receiving said radio magnetic frequency signals for exciting said nuclei and for delivering said radio frequency signal emitted by said excited nuclei.

2. A radio frequency coil as claimed in claim 1, wherein each of said annular conductors comprises a one-piece ring.

3. A radio frequency coil as claimed in claim 1, wherein each of said annular conductor means comprises at least one pair of circumferentially-extending arcuate electrically conducting plates which are symmetrically disposed about said prescribed axis in the shape of a ring, the ends of adjacent plates being electrically connected with one another, the number of plates forming each annular conductor being equal to the number of said longitudinal conductor groups, each of said plates being secured to one end of one of said longitudinal conductor goups.

4. A radio frequency coil as claimed in claim 3, wherein adjacent plates are connected by a capacitor element.

5. A radio frequency coil as claimed in claim 4, wherein said capacitor element is a fixed capacitor.

6. A radio frequency coil as claimed in claim 4, wherein said capacitor element is a variable capacitor.

7. A radio frequency coil as claimed in claim 3, wherein adjacent plates are connected by conductive coupling.

8. A radio frequency coil as claimed in claim 7, wherein adjacent plates are connected by pressure welding.

9. A radio frequency coil as claimed in claim 7, wherein adjacent plates are connected by soldering.

10. A radio frequency coil as claimed in claim 7, wherein adjacent plates are connected by an electrical conductor.

11. A radio frequency coil as claimed in claim 1, further comprising a pair of electrically conducting guard rings which are coaxially disposed with respect to said prescribed axis at opposite ends of said coil inside said annular conductors, said guard rings being electrically insulated from the inner surface of said annular conductors, at least one of said guard rings being grounded.

12. A radio frequency coil as claimed in claim 11, wherein said guard rings are supported so as to be movable in the longitudinal direction of said coil, said coil further comprising an electrically insulating link which is connected to both of said guard rings.

13. A radio frequency coil as claimed in claim 1, wherein at least one of the longitudinal conductor groups in each pair of longitudinal conductor groups is transversely divided at its midportion into two halves, the ends of the longitudinal conductors in each half are short circuited, and the short-circuited ends of one half are connected with the short-circuited ends of the other half by a capacitor element.

14. A radio frequency coil as claimed in claim 13, wherein said capacitor element which connects said short circuited ends is a variable capacitor.

15. A radio frequency coil as claimed in claim 1, wherein said longitudinal conductors of said longitudinal conductor groups are electrically conducting wires.

16. A radio frequency coil as claimed in claim 1, wherein said longitudinal conductors of said longitudinal conductor groups are electrically conducting tubes.

17. A radio frequency coil as claimed in claim 1, wherein said longitudinal conductors of said longitudinal conductor groups are electrically conducting plates.

18. A radio frequency coil as claimed in claim 1, wherein said coil has a cylindrical transverse cross-sectional shape.

19. A radio frequency coil as claimed in claim 1, wherein said coil has an elliptical transverse cross-sectional shape.

20. A radio frequency coil as claimed in claim 19, wherein said coil comprises a single pair of longitudinal conductor groups which are disposed at opposite ends of the major axes of the transverse cross sections of said coil.

21. A radio frequency coil as claimed in claim 19, wherein said coil comprises a single pair of longitudinal conductor groups which are disposed at opposite ends of the minor axes of the transverse cross sections of said coil.

22. A radio frequency coil as claimed in claim 1, further comprising balanced feed means for feeding balanced currents to said coil.

23. A radio frequency coil for nuclear magnetic resonance imaging comprising:
   annular conductor means including two annular conductors which are made of an electrically conducting material and which are coaxially disposed with respect to a prescribed axis; and
   at least one pair of longutudinal conductor groups which are symmetrically disposed about said prescribed axis, each of said longitudinal conductor groups comprising a plurality of electrical conductors which extend longitudinally in parallel to said prescribed axis, which are separated from one another in the circumferential direction of said coil, and which have one end secured to and electrically connected to one of said annular conductors and the other end secured to and electrically connected to said other annular conductor wherein each of said longitudinal conductor groups is transversely divided at its midportion into two halves so as to transversely divide said coil into two halves, each half of said coil being supported such that at least one of the halves of said coil can be moved longitudinally with respect to the other half, said coil further comprising variable capacitance means for connecting the two halves of each longitudinal conductor group by capacitive coupling, the capacitance of said variable capacitor means varying when the two halves of said coil are moved longitudinally with respect to one another, wherein said variable capacitor means comprises a plurality of electrically conducting short-circuiting plates, each of said short-circuiting plates being secured to the end of one of the halves of each longitudinal conductor group so as to short circuit the longitudinal conductors in that half, the short-circuiting plates of one half of said coil overlapping the short-circuiting plates of the other half of said coil in the longitudinal direction; and
   a dielectric material which is disposed between the short-circuiting plates of said two halves of said coil in the overlapping portions, said dielectric material being secured to the short-circuiting plates of only one of the halves of said coil and being in sliding contact with the short-circuiting plates of said other half of said coil.

* * * * *